United States Patent
Kutsukake

(10) Patent No.: US 10,134,733 B2
(45) Date of Patent: Nov. 20, 2018

(54) SEMICONDUCTOR DEVICE

(71) Applicant: TOSHIBA MEMORY CORPORATION, Tokyo (JP)

(72) Inventor: Hiroyuki Kutsukake, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 38 days.

(21) Appl. No.: 15/258,195

(22) Filed: Sep. 7, 2016

(65) Prior Publication Data

US 2017/0213827 A1     Jul. 27, 2017

(30) Foreign Application Priority Data

Jan. 22, 2016 (JP) .................................. 2016-010565

(51) Int. Cl.

| | |
|---|---|
| *H01L 27/092* | (2006.01) |
| *H01L 29/06* | (2006.01) |
| *H01L 29/10* | (2006.01) |
| *H01L 21/266* | (2006.01) |
| *H01L 21/8238* | (2006.01) |

(52) U.S. Cl.
CPC ........ *H01L 27/0922* (2013.01); *H01L 21/266* (2013.01); *H01L 21/823892* (2013.01); *H01L 29/0653* (2013.01); *H01L 29/0692* (2013.01); *H01L 29/1079* (2013.01); *H01L 29/1087* (2013.01)

(58) Field of Classification Search
CPC ............. H01L 27/0925; H01L 27/0927; H01L 27/0928; H01L 27/0922
See application file for complete search history.

(56) References Cited

U.S. PATENT DOCUMENTS

| | | |
|---|---|---|
| 9,047,951 B2 | 6/2015 | Futatsuyama |
| 9,437,596 B2 * | 9/2016 | Ariyoshi ............. H01L 27/0928 |
| 2002/0031882 A1 * | 3/2002 | Uchida ........... H01L 21/823462 |
| | | 438/228 |

FOREIGN PATENT DOCUMENTS

| | | |
|---|---|---|
| JP | 2010-153523 A | 7/2010 |
| JP | 2010-199301 A | 9/2010 |
| JP | 2014-049472 A | 3/2014 |

* cited by examiner

*Primary Examiner* — Marc Armand
(74) *Attorney, Agent, or Firm* — Foley & Lardner LLP

(57) ABSTRACT

A semiconductor device includes a semiconductor substrate and a control electrode provided on a first surface side of the semiconductor substrate. The semiconductor substrate includes a first area on the first surface side and two second areas on the first surface side of the first area. The two second areas are arranged along the first surface. The control electrode provided above a portion of the first area between the two second areas. The first area includes a main portion and a peripheral edge portion extending outward from the main portion along the first surface. A depth of the peripheral edge portion from the first surface is shallower than a depth of the main portion from the first surface; and the peripheral edge portion has a concentration of second conductivity type impurities lower than a concentration of the second conductivity type impurities at a surface of the main portion.

20 Claims, 12 Drawing Sheets

SEMICONDUCTOR DEVICE

CROSS-REFERENCE TO RELATED APPLICATIONS

This application is based upon and claims the benefit of priority from Japanese Patent Application No. 2016-010565, filed on Jan. 22, 2016; the entire contents of which are incorporated herein by reference.

FIELD

Embodiments are related generally to a semiconductor device.

BACKGROUND

Some semiconductor devices comprise an integrated circuit including a plurality of transistors. For example, an integrated circuit that drives a semiconductor memory includes a transistor operating under a high voltage. Such a transistor is provided in a P-type or N-type well of a semiconductor substrate in order to be electrically insulated from a low voltage portion. Thus, it is desired for the integrated circuit operating stably to improve the breakdown voltage of the well.

DETAILED DESCRIPTION

Figure 1A:
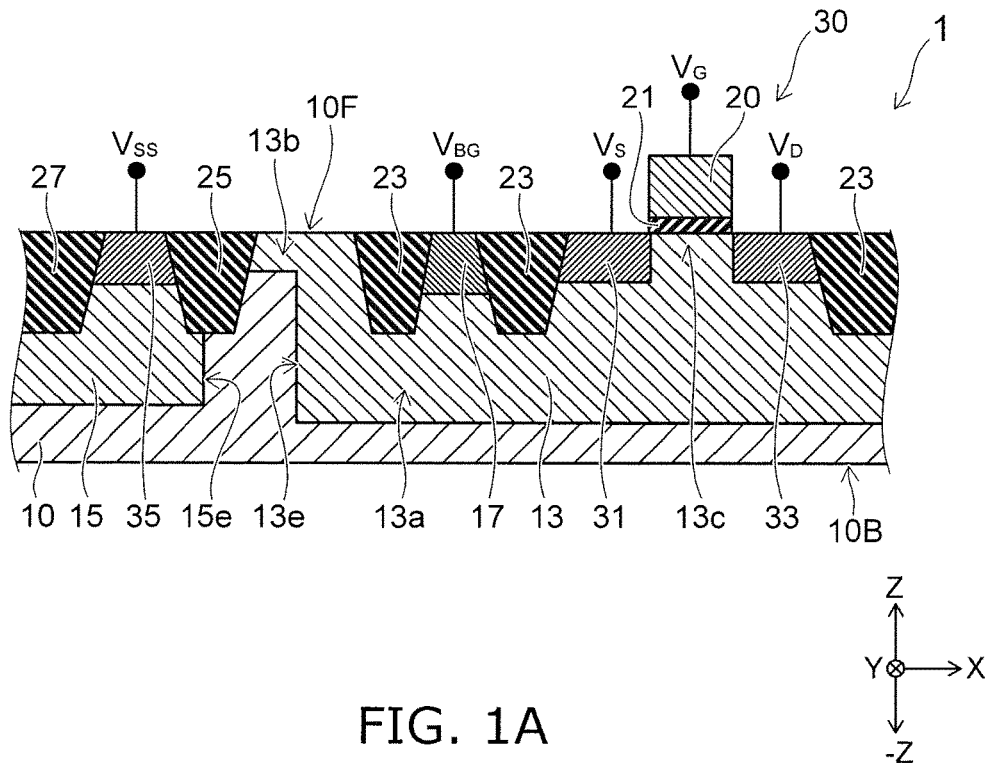
FIGS. 1A and 1B are schematic views showing a semiconductor device according to a first embodiment.

According to an embodiment, a semiconductor device includes a semiconductor substrate of a first conductivity type including a first surface and a second surface on a side opposite to the first surface, and a control electrode provided on the first surface side of the semiconductor substrate. The semiconductor substrate includes a first area of a second conductivity type on the first surface side and two second areas of the first conductivity type on the first surface side of the first area. The two second areas are disposed away from an edge of the first area and arranged in a direction along the first surface. The control electrode provided above a portion of the first area between the two second areas. The first area includes a main portion and a peripheral edge portion extending outward from the main portion along the first surface. A depth of the peripheral edge portion from the first surface is shallower than a depth of the main portion from the first surface; and the peripheral edge portion has a concentration of second conductivity type impurities lower than a concentration of the second conductivity type impurities at a surface of the main portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward. The following examples are illustrative; and each of embodiments is not limited to these examples. In the following examples, a description will be given on the assumption that a first conductivity type is P type and a second conductivity type is N type; in another example, however, the first conductivity type may be N type and the second conductivity type may be P type. Moreover, elements described in each of the examples may be applied to other examples if technically possible.

First Embodiment

Figure 1B:
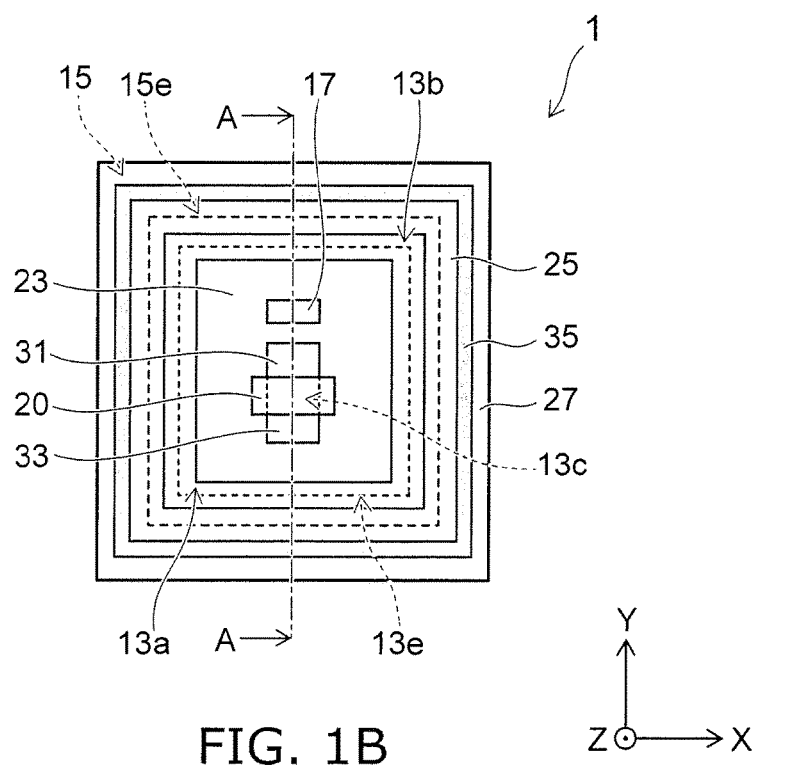

FIGS. 1A and 1B are schematic views showing a portion of a semiconductor device 1 according to a first embodiment. FIG. 1A is a partial sectional view along the line A-A shown in FIG. 1B. FIG. 1B is a top view of the semiconductor device 1.

The semiconductor device 1 includes, for example, a semiconductor substrate 10 and a control electrode (hereinafter gate electrode 20). The semiconductor substrate 10 is, for example, a P-type silicon substrate, and includes a first surface 10F and a second surface 10B.

As shown in FIG. 1A, the semiconductor substrate 10 includes a first area of the N-type conductivity (hereinafter N-type well 13) provided on the first surface 10F side. The semiconductor substrate 10 includes, on the first surface 10F side of the N-type well 13, source area 31 and drain area 33 arranged side by side in a direction (Y-direction) along the first surface 10F, and (N-type contact area 17 provided adjacent to the source area 31. The source area 31 and the drain area 33 include P-type impurities doped at a higher concentration than the N-type impurities in the N-type well 13. The N-type contact area 17 includes N-type impurities at a higher concentration than the N-type impurities in the N-type well 13.

The gate electrode 20 is provided above a portion of the N-type well 13 (hereinafter channel area 13c) between the source area 31 and the drain area 33 on the first surface 10F side. A gate insulating layer 21 is provided between the channel area 13c and the gate electrode 20.

The semiconductor device 1 further includes insulating layers (hereinafter Shallow Trench Isolations: STIs) provided on the first surface 10F side of the semiconductor substrate 10. The STIs 23, 25, and 27 are each provided so as to have a predetermined depth from the first surface 10F in a −Z-direction. Each depth of the STIs 23, 25, and 27 is shallower than the depth of the N-type well 13 from the first surface 10F, and is shallower than the depth of a P-type well 15 from the first surface 10F. The semiconductor substrate 10 further includes, on the first surface 10F side, the P-type well 15 provided so as to surround the N-type well 13 (see FIG. 1B). The STIs 25 and 27 are provided on the P-type well 15.

As shown in FIG. 1B, the STI 23 is selectively provided on the N-type well 13, and surrounds the channel area 13c, the source area 31, and the drain area 33. The gate electrode 20 extends in the X-direction above the channel area 13c. The STI 23 also surrounds, for example, the N-type contact area 17 adjacent to the source area 31. The N-type contact area 17 includes N-type impurities at a higher concentration than the N-type impurity in the N-type well 13.

The STI 25 is selectively provided on the first surface 10F side of the semiconductor substrate 10, and surrounds the N-type well 13. The STI 25 is provided at a position separated from the STI 23; and a portion of the N-type well 13 is exposed between the STI 23 and the STI 25. The N-type well 13 includes a main portion 13a and a peripheral edge portion 13b. The source area 31 and the drain area 33 are provided in the main portion 13a. The peripheral edge portion 13b extends outward from the main portion 13a along the first surface 10F. For example, an outer peripheral portion of the main portion 13a and the peripheral edge portion 13b are exposed between the STI 23 and the STI 25. The peripheral edge portion 13b is provided, for example, so as to be in contact with the STI 25.

The STI 27 is provided so as to surround the STI 25. The STI 27 is provided at a position separated from the STI 25; and a P-type contact area 35 is exposed between the STI 25 and the STI 27. The P-type contact area 35 is selectively provided on the P-type well 15. The P-type contact area 35 includes P-type impurities at a higher concentration than the P-type impurities in the P-type well 15. Moreover, an edge 15e of the P-type well 15 is located below the STI 25.

FIGS. 1A and 1B show, for example, a high voltage-type PMOS transistor 30, in which a source voltage $V_S$, a drain voltage $V_D$, and a back gate voltage $V_{BG}$ are applied respectively to the source area 31, the drain area 33 and the N-type contact area of the PMOS transistor 30. These voltages are, for example, a high voltage of appropriately 30 V. On the other hand, a gate voltage $V_G$ is applied to the gate electrode 20; and a source voltage $V_{SS}$ is applied to the P-type contact area 35. The gate voltage $V_G$ and the source voltage $V_{SS}$ are at a low potential of several volts. Hence, a high potential difference is generated between the N-type well 13 and the P-type well 15. Thus, a leak current may become large between the N-type well and the P-type well, when the breakdown voltage of the N-type well 13 is low. Moreover, there is a case where the PMOS transistor 30 cannot be operated under a high voltage.

Figure 2:
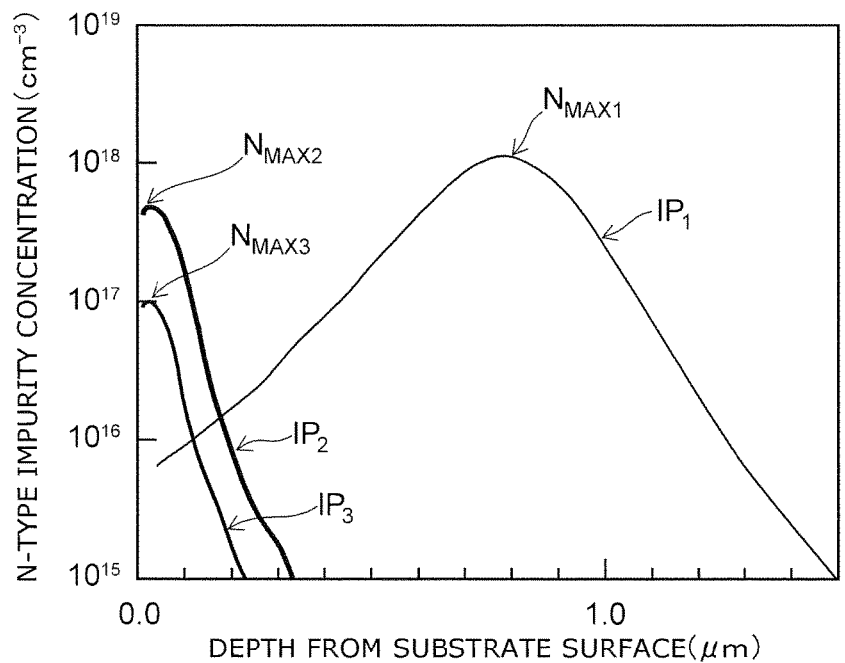
FIG. 2 is a graph showing N-type impurity concentration profiles of the N-type well of the semiconductor device according to the first embodiment.

FIG. 2 is a graph showing N-type impurity profiles of the N-type well 13. The vertical axis is an N-type impurity concentration (cm$^{-3}$), while the horizontal axis is a depth (μm) in the −Z-direction from a substrate surface (the first surface 10F). $IP_1$ and $IP_2$ shown in FIG. 2 are N-type impurity profiles of the main portion 13a; and $IP_3$ is an N-type impurity profile of the peripheral edge portion 13b.

The main portion 13a is formed, for example, by two ion implantations. The N-type impurity shown by the profile $IP_1$ is ion-implanted at a higher energy than the N-type impurity shown by the profile $IP_2$. The profile $IP_1$ has a peak at a position deeper than the profile $IP_2$, and a peak concentration $N_{MAX1}$ of the profile $IP_1$ is higher than a peak concentration $N_{MAX2}$ of the profile $IP_2$. Moreover, the peak of the profile $IP_2$ is located in the vicinity of the first surface 10F.

As shown in FIG. 2, the profile $IP_3$ has a peak in the vicinity of the first surface 10F, and a peak concentration $N_{MAX3}$ of the profile $IP_3$ is lower than the peak concentration $N_{MAX2}$ of the profile $IP_2$. That is, the peripheral edge portion 13b of the N-type well 13 has a depth from the first surface 10F, which is shallower than the depth of the main portion 13a from the first surface 10F. Moreover, an N-type impurity concentration in the peripheral edge portion 13b is lower than a surface concentration of the N-type impurity in the main portion 13a of the N-type well 13.

By providing the peripheral edge portion 13b described above, the breakdown voltage of the N-type well 13 can be improved. That is, the peripheral edge portion 13b promotes the broadening of a depletion layer at an edge 13e of the N-type well 13, and relaxes an electric field at the edge 13e. Thus, it is possible to reduce the leak current of the N-type well 13 and stably operate the PMOS transistor 30.

Figure 3:
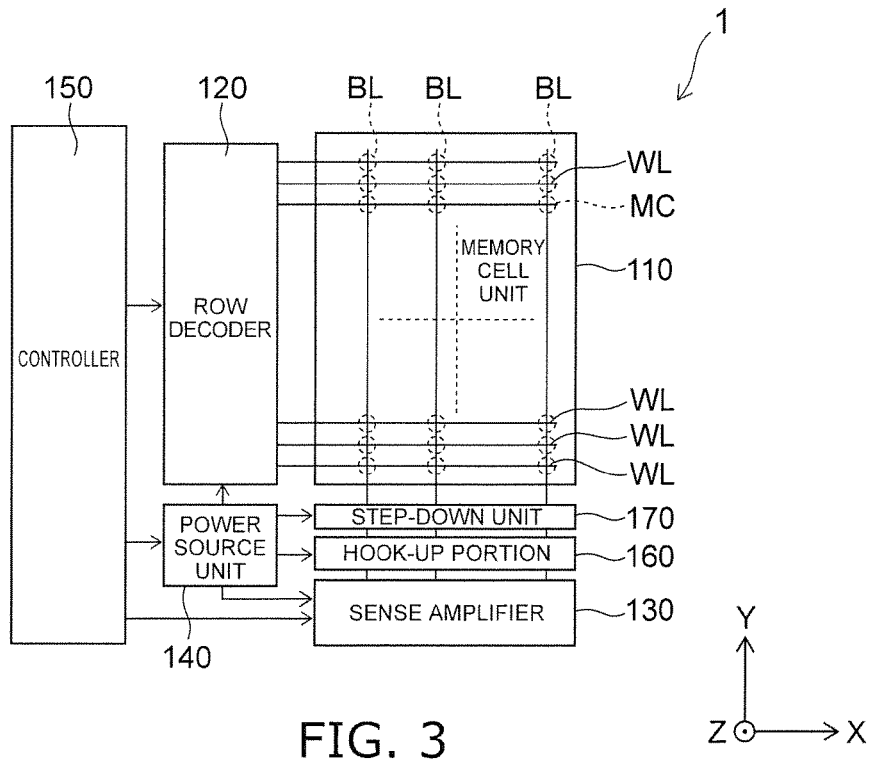
FIG. 3 is a block diagram showing the semiconductor device according to the first embodiment.

FIG. 3 is a block diagram showing an example of the semiconductor device 1. The semiconductor device 1 is, for example, a NAND type semiconductor memory device. The semiconductor device 1 includes, for example, a memory cell unit 110, a row decoder 120, a sense amplifier 130, a power source unit 140, and a controller 150.

The memory cell unit 110 includes, for example, a plurality of memory cells MC three-dimensionally disposed in the X-direction, the Y-direction, and the Z-direction. The row decoder 120 is electrically connected to the memory cells MC via word lines WS. The sense amplifier 130 is electrically connected to bit lines BL via a hook-up portion 160 and a step-down unit 170. The bit lines BL are each electrically connected to a NAND string including a plurality of memory cells MC.

The power source unit 140 supplies a predetermined voltage to the row decoder 120, the sense amplifier 130, the hook-up portion 160, and the step-down unit 170. The control unit 150 drives the row decoder 120, the sense amplifier 130, and the power source unit 140, and thus, operates the memory cell unit 110.

For example, the row decoder 120 applies a high voltage to the word line WS at the time of programming data to the memory cell MC. The row decoder 120 includes, for example, the high voltage-type PMOS transistor 30 shown in FIGS. 1A and 1B.

Then, a method for manufacturing the semiconductor device 1 will be described with reference to FIG. 4A to FIG. 7C. FIG. 4A to FIG. 7C are schematic sectional views showing, in sequence, the manufacturing process of the semiconductor device 1. FIG. 4A to FIG. 7C are sectional views along the line A-A shown in FIG. 1B.

Figure 4A:
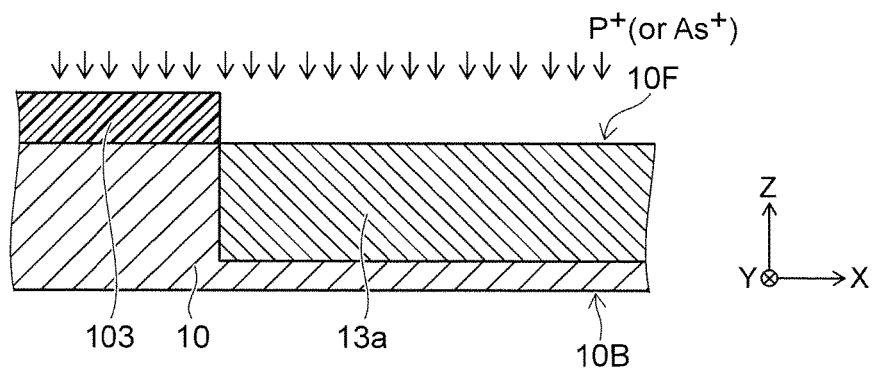
FIGS. 4A to 7C are schematic sectional views showing the manufacturing process of the semiconductor device according to the first embodiment.

As shown in FIG. 4A, an ion implantation mask 103 is formed on the first surface 10F of the semiconductor substrate 10, and, for example, phosphorus (P) or arsenic (As), which is an N-type impurity, is selectively ion-implanted. The semiconductor substrate 10 is, for example, a P-type silicon substrate doped with the P-type impurity at appropriately 1×10$^{15}$ cm$^{-3}$. Ion implantation is carried out, for example, twice while changing implanting energy. Subsequently, the ion-implanted N-type impurities are activated to form the main portion 13a of the N-type well 13 by thermally annealing the semiconductor substrate 10.

Figure 4B:
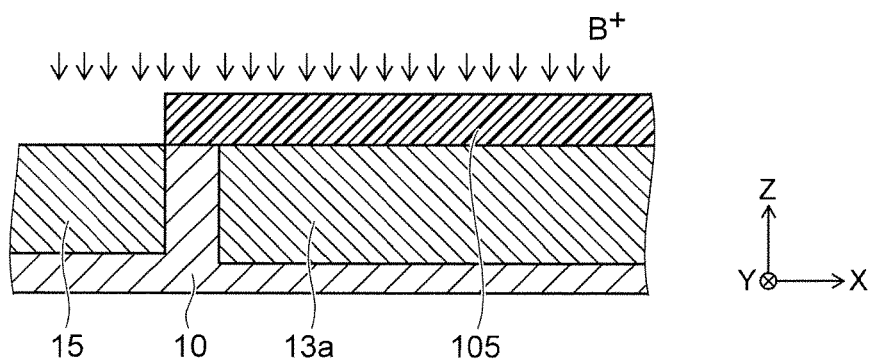

As shown in FIG. 4B, an ion implantation mask 105 is formed on the first surface 10F, and, for example, boron (B), which is a P-type impurity, is selectively ion-implanted. Subsequently, the ion-implanted P-type impurities are activated to form the P-type well 15 by thermally annealing the semiconductor substrate 10.

Figure 4C:
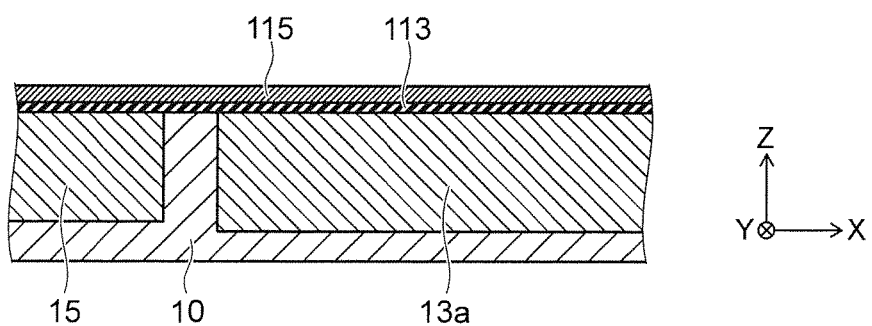

As shown in FIG. 4C, an insulating layer 113 and a conductive layer 115 are formed on the first surface 10F. The insulating layer 113 is, for example, a silicon oxide layer, and is formed by thermally oxidizing a surface of the silicon substrate. The conductive layer 115 is, for example, a polysilicon layer having conductivity, and is deposited on the insulating layer 113 using CVD (Chemical Vapor Deposition).

Figure 5A:
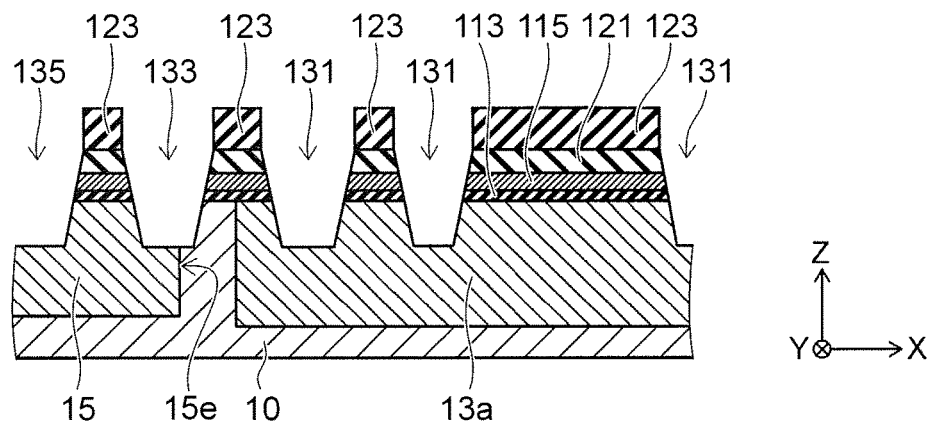

As shown in FIG. 5A, an insulating layer 121 and an etching mask 123 are formed on the conductive layer 115. The insulating layer 121 is, for example, a silicon nitride layer. The etching mask 123 is formed using, for example, silicon oxide. Subsequently, the insulating layer 121, the conductive layer 115, the insulating layer 113, and the semiconductor substrate 10 are selectively removed to form trenches 131, 133 and 135 by etching using the etching mask 123.

The trench 131 is formed to have a depth capable of reaching the main portion 13a of the N-type well 13 from a surface of the insulating layer 121. The trench 133 is formed on the edge 15e of the P-type well 15. The trench 135 is formed to have a depth capable of reaching the P-type well 15 from the surface of the insulating layer 121.

Figure 5B:
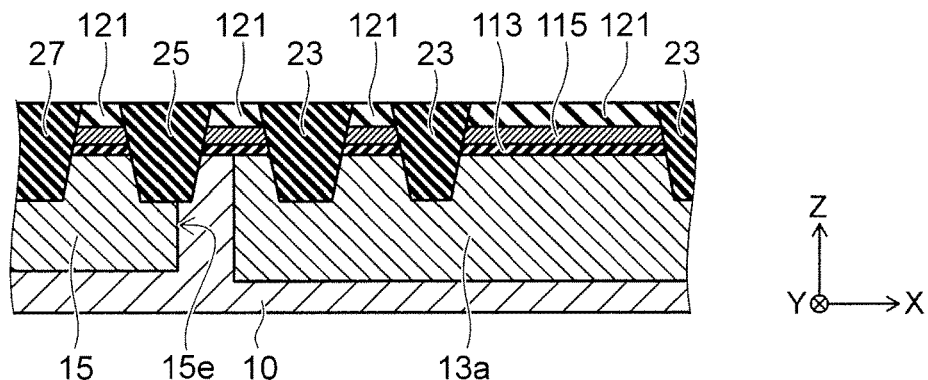

As shown in FIG. 5B, the STIs 23, 25, and 27 are formed on the semiconductor substrate 10. The STIs 23, 25, and 27 are, for example, silicon oxide, and are embedded in the trenches 131, 133, and 135, respectively.

For example, a silicon oxide layer that is embedded in the trenches 131, 133, and 135 and covers the surface of the insulating layer 121 is formed using CVD on the semiconductor substrate 10. Subsequently, the silicon oxide layer deposited on the insulating layer 121 is removed using CMP (Chemical Mechanical Polishing) while leaving the portions embedded in the trenches 131, 133, and 135. The insulating layer 121 acts as a stopper layer for CMP.

Figure 5C:
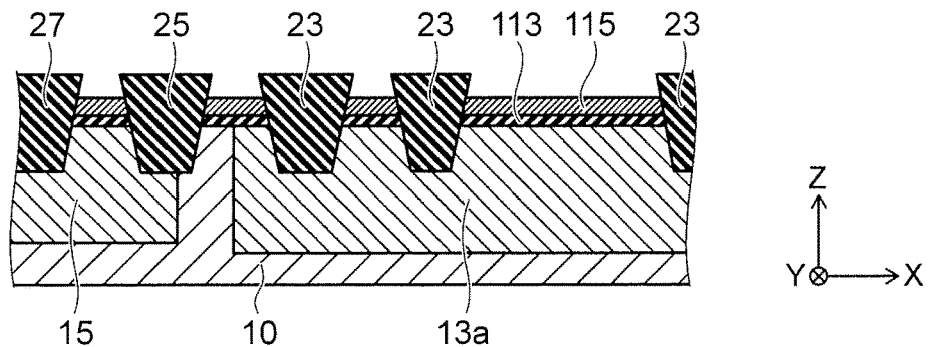

As shown in FIG. 5C, the insulating layer 121 is selectively removed. When a silicon nitride layer is used for the insulating layer 121, the insulating layer 121 can be removed without etching the STIs 23, 25, and 27 and the conductive layer 115, for example, by wet etching using phosphoric acid.

Figure 6A:
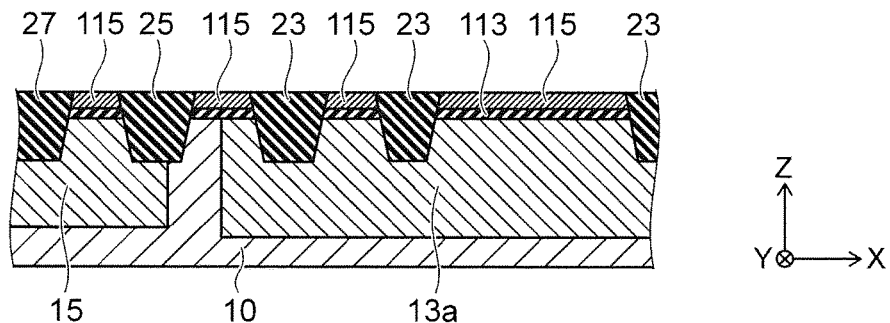

As shown in FIG. 6A, the STIs 23, 25, and 27 are etched using, for example, isotropic dry etching, and the levels of surfaces of the STIs 23, 25, and 27 and a surface of the conductive layer 115 are favorably made coincident with each other.

Figure 6B:
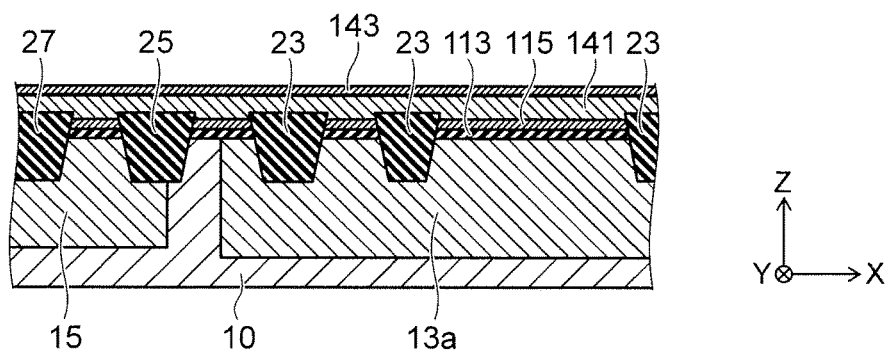

As shown in FIG. 6B, a conductive layer 141 is formed on the conductive layer 115; and a metal layer 143 is formed on the conductive layer 141. The conductive layer 141 covers the STIs 23, 25 and 27. The conductive layer 141 is, for example, a polysilicon layer having conductivity. The metal layer 143 includes, for example, at least one of tungsten (W), tungsten silicide (WSi), cobalt silicide (CoSi), and nickel silicide (NISI).

Figure 6C:
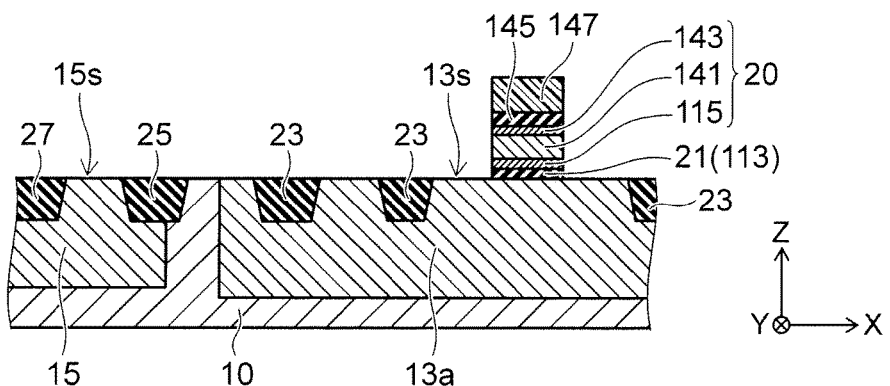

As shown in FIG. 6C, an etching mask 145 is formed on the metal layer 143, and the metal layer 143, the conductive layers 141, 115, and the insulating layer 113 are selectively removed. Thus, a gate insulating layer 21 and the gate electrode 20 are formed on a surface 13s of the main portion 13a of the N-type well 13.

The etching mask 145 is, for example, silicon nitride, and is formed using CVD. Further, the etching mask 145 is formed into a predetermined shape (see FIG. 1B) with a resist mask 147 formed using photolithography. Subsequently, the metal layer 143, the conductive layers 141, 115, and the insulating layer 113 are selectively removed to form the gate electrode 20, for example, using anisotropic dry etching. Further, the STIs 23, 25, and 27 are etched using, for example, isotropic dry etching, and upper surfaces of the STIs 23, 25, and 27 are favorably made coincident with the level of the first face 10F of the semiconductor substrate 10. Moreover, at the same time, the insulating layer 113 is selectively removed to form the gate insulating layer 21.

Figure 7A:
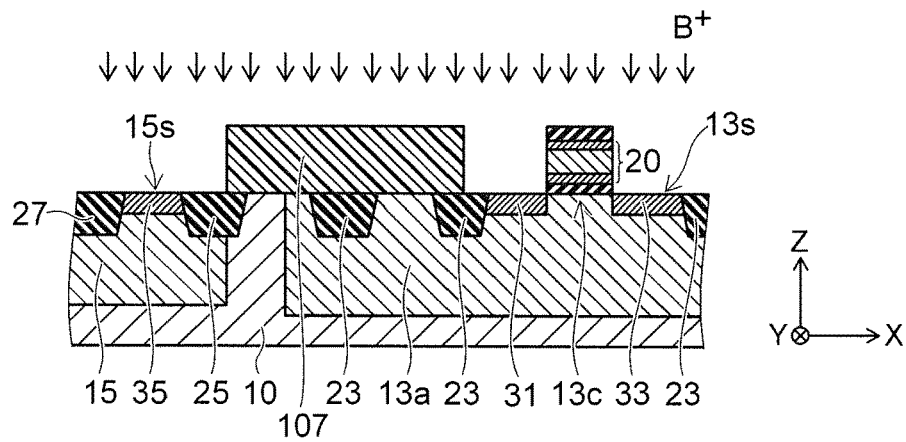

As shown in FIG. 7A, for example, boron (B), which is a P-type impurity, is selectively ion-implanted to form the source area 31, the drain area 33, and the P-type contact area 35. For example, an ion implantation mask 107 is formed on the semiconductor substrate 10, and the P-type impurities are selectively ion-implanted into the surface 13s of the N-type well and a surface 15s of the P-type well 15. Thereby, the channel area 13c is formed below the gate electrode 20.

Figure 7B:
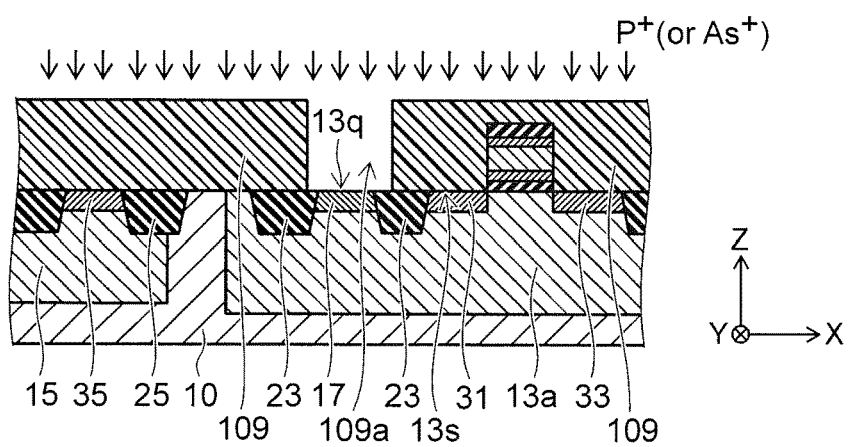

As shown in FIG. 7B, phosphorus (P) or arsenic (As), which is an N-type impurity, is selectively ion-implanted into a surface 13q of the N-type well adjacent to the surface 13s so as to form the N-type contact area 17. For example, an ion implantation mask 109 having an opening 109a is formed on the semiconductor substrate 10. The opening 109a communicates with the surface 13q of the main portion 13a of the N-type well 13. Subsequently, the N-type impurities are selectively ion-implanted into the surface 13q of the main portion 13a.

Figure 7C:
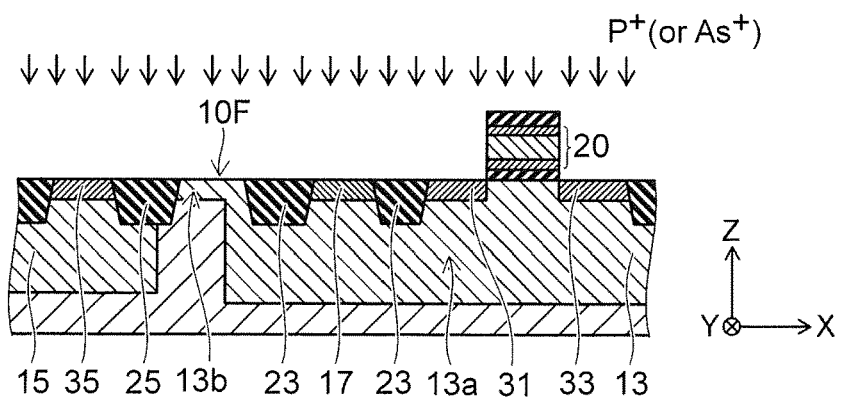

As shown in FIG. 7C, the N-type impurities are ion-implanted into the first surface 10F of the semiconductor substrate 10 to form the peripheral edge portion 13b of the N-type well 13. The ion implantation of the N-type impurity in this step may be carried out, for example, at the same time as the ion implantation into the channel of a transistor that is formed in another area.

The concentration of the N-type impurity in the peripheral edge portion 13b is lower than the concentration of P-type impurity in the source area 31, the drain area 33, and the P-type contact area 35. Moreover, the peripheral edge portion 13b can be formed with a dose amount lower than a dose amount in forming the main portion 13a of the N-type well 13. For this reason, the peripheral edge portion 13b may be formed, for example, by blanket implantation of the N-type impurity without forming an ion implantation mask.

Then, interconnects are formed so as to be electrically connected respectively to the gate electrode 20, the source area 31, the drain area 33, the N-type contact area 17, and the P-type contact area 35 after forming an inter-layer insulating layer which covers the first surface 10F of the semiconductor substrate 10, thereby completing the semiconductor device 1.

Figure 8A:
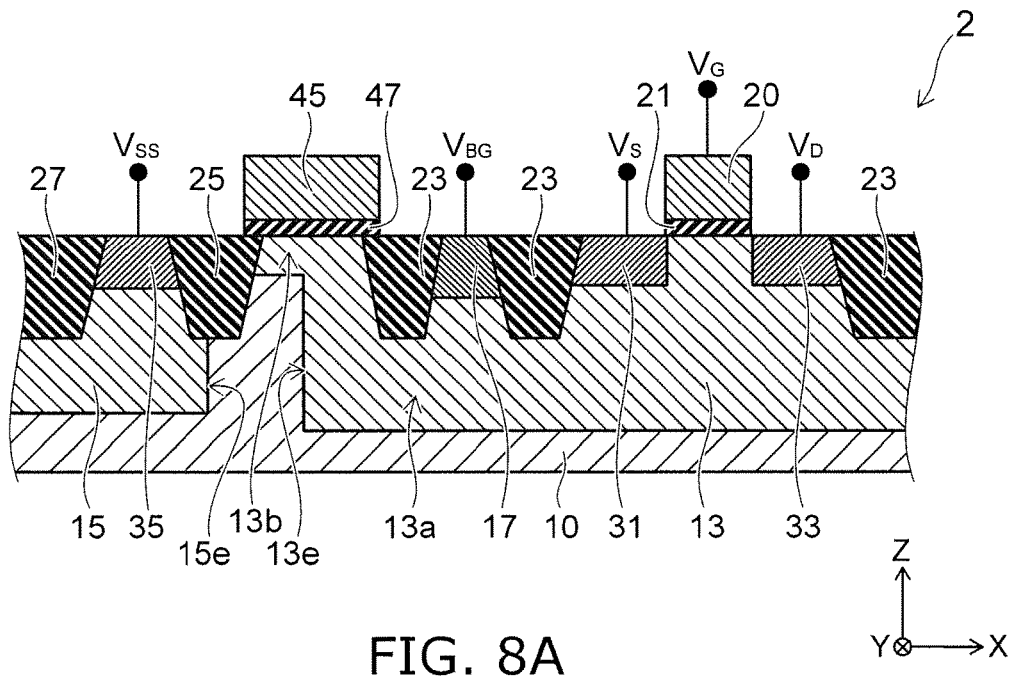
FIGS. 8A and 8B are schematic views showing a semiconductor device according to a variation of the first embodiment.
Figure 8B:
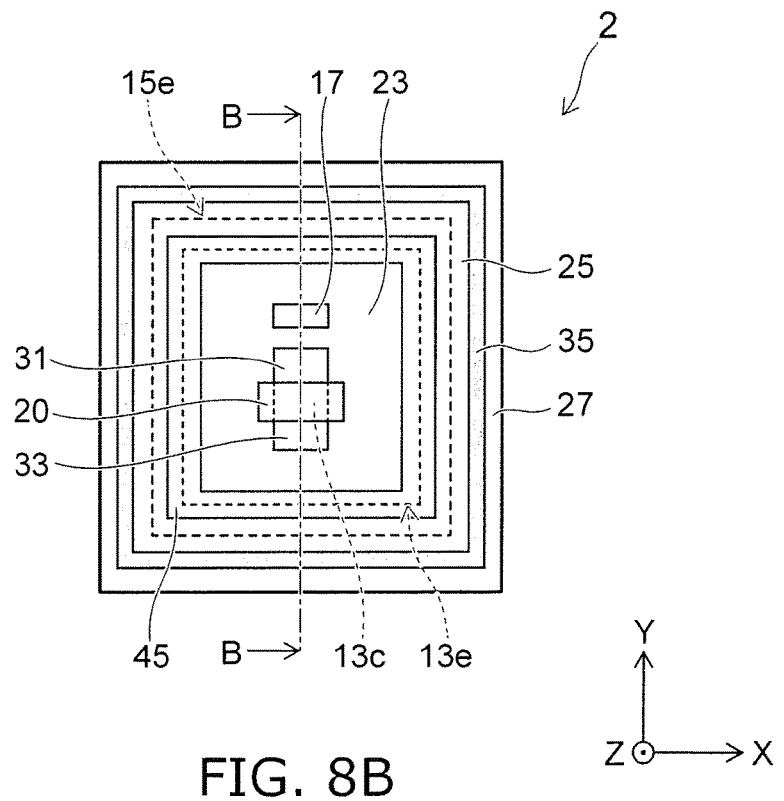

FIGS. 8A and 8B are schematic views showing a semiconductor device 2 according to a variation of the first embodiment. FIG. 8A is a partial sectional view along the line B-B shown in FIG. 8B. FIG. 8B is a top view of the semiconductor device 2.

As shown in FIG. 8A, the semiconductor device 2 includes the semiconductor substrate 10 having the N-type well 13 and the P-type well 15, and the gate electrode 20. The source area 31, the drain area 33, and the N-type contact area 17 are provided in the N-type well 13. The P-type contact area 35 is provided in the P-type well 15. Then, the semiconductor device 2 further includes, on the first surface 10F side of the semiconductor substrate 10, a conductive layer 45 selectively provided above the peripheral edge portion 13b of the N-type well 13. The conductive layer 45 is provided above the peripheral edge portion 13b with an insulating layer 47 interposed between the peripheral edge portion 13b and the conductive layer 45, and includes the same material as the gate electrode 20.

As shown in FIG. 8B, the conductive layer 45 is provided above the peripheral edge portion 13b of the N-type well 13 so as to surround the N-type well 13.

The peripheral edge portion 13b is formed, for example, in the process of forming the main portion 13a of the N-type well and the P-type well 15 shown in FIG. 4A and FIG. 4B. For example, the peripheral edge portion 13b is formed by adding blanket implantation of the N-type impurity in the ion implantation process shown in FIG. 4A and FIG. 4B. Thereafter, the semiconductor device 2 is formed by leaving the conductive layer 45 above the peripheral edge portion 13b in the forming process of the gate electrode 20 shown in FIG. 6C.

The conductive layer 45 serves as an ion implantation mask after the process shown in FIG. 6C, and maintains the impurity concentration profile in the peripheral edge portion 13b of the N-type well 13. Thereby, it becomes possible to improve the insulation breakdown voltage of the N-type well 13.

Second Embodiment

Figure 9A:
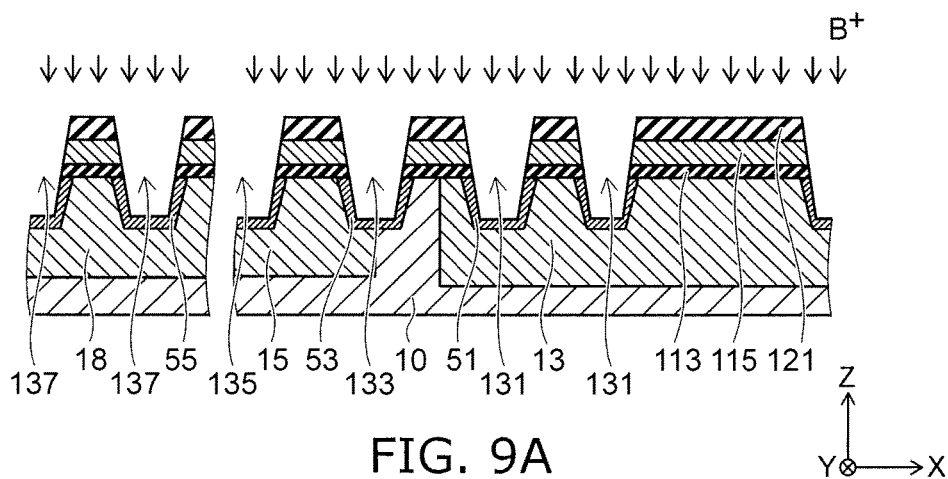
FIGS. 9A to 9C are schematic sectional views showing a method for manufacturing a semiconductor device according to a second embodiment.
Figure 9B:
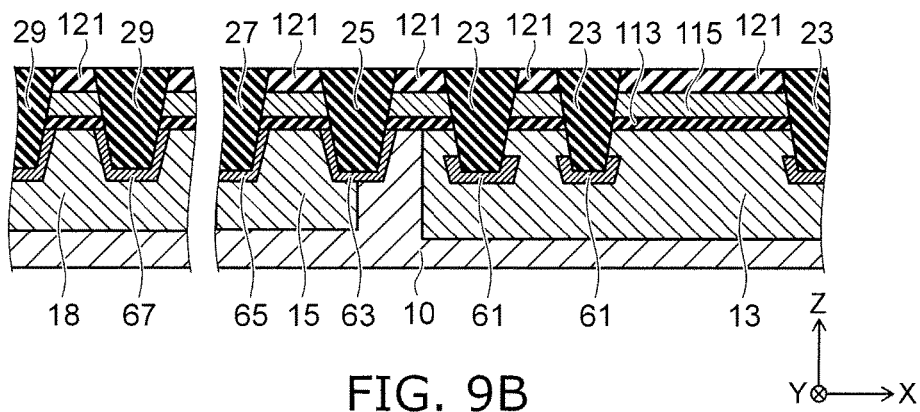
Figure 9C:
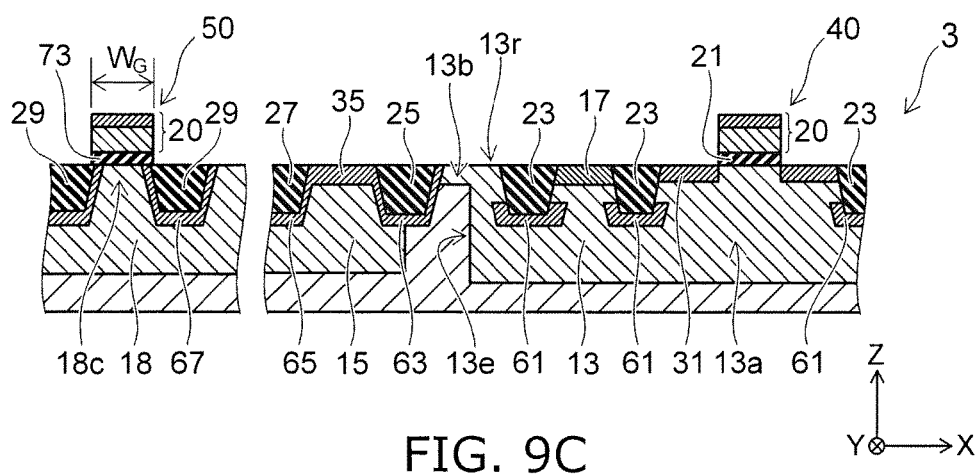
Figure 10:
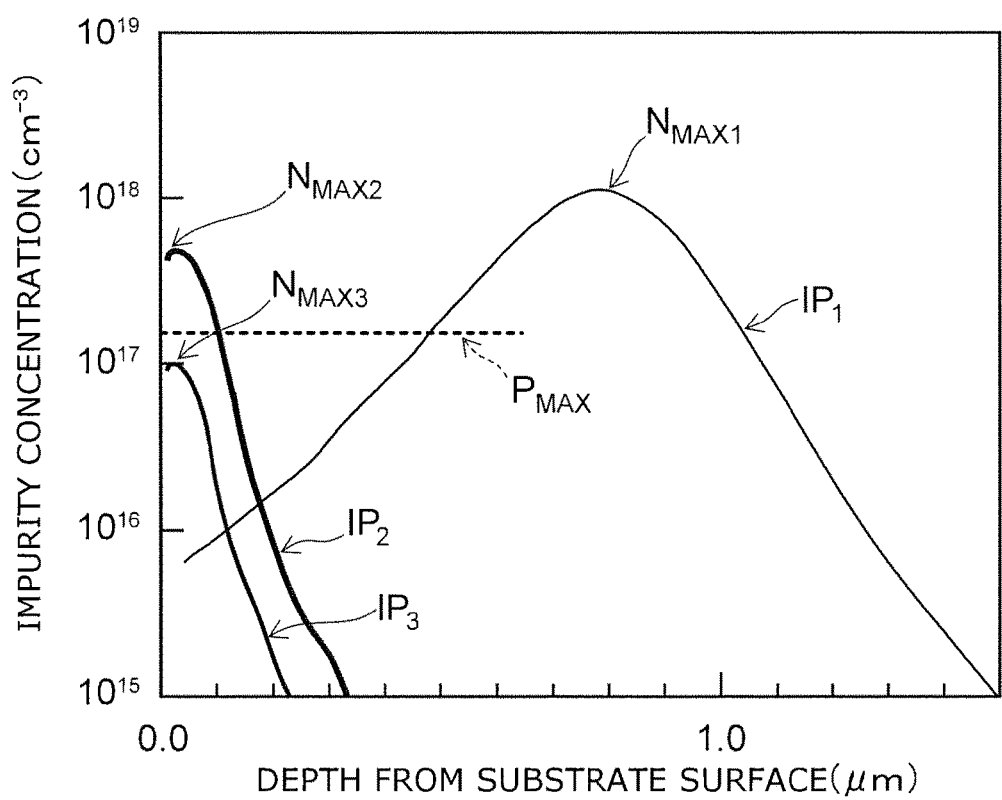
FIG. 10 is a graph showing N-type impurity concentration profiles of the N-type well of the semiconductor device according to the second embodiment.

FIGS. 9A to 9C are schematic sectional views showing a method for manufacturing a semiconductor device 3 according to a second embodiment. FIGS. 9A to 9C are sectional views along the line A-A shown in FIG. 1B. FIG. 10 is a graph showing impurity profiles of the N-type well 13 according to the second embodiment. The vertical axis is an impurity concentration ($cm^{-3}$), while the horizontal axis is a depth (μm) from a substrate surface (the first surface 10F) in the −Z-direction.

For example, after the trenches 131, 133, and 135 are formed in the process shown in FIG. 5A, boron (B), which is a P-type impurity, is ion-implanted into an inner surface of each of the trenches as shown in FIG. 9A. Further, the P-type impurities are also ion-implanted into an inner surface of a trench 137 formed in a P-type well 18 that is different from the P-type well 15. Subsequently, the P-type impurities are activated by thermally annealing the semiconductor substrate 10.

FIG. 9B shows the STI 23 embedded in the trench 131, the STI 25 embedded in the trench 133, the STI 27 embedded in the trench 135, and an STI 29 embedded in the trench 137.

As shown in FIG. 9B, a P-type area 63 is formed in a portion where the STI 25 and the semiconductor substrate 10 are in contact with each other. Similarly, a P-type area 65 is formed in a portion where the STI 27 and the P-type well 15 are in contact with each other; and a P-type area 67 is formed in a portion where the STI 29 and the P-type well 18 are in contact with each other. On the other hand, a P-type area 61 is formed in a portion where the STI 23 is in contact with the N-type well at a bottom portion of the STI 23. That is, the semiconductor substrate 10 has an impurity distribution in which the concentration of the P-type impurity becomes higher toward the bottom surfaces of the STIs 25, 27, and 29.

Subsequently, the peripheral edge portion 13b of the N-type well 13, the N-type contact area 17, the gate electrode 20, the source area 31, the drain area 33, and the P-type contact area 35 are formed by the manufacturing process shown in FIG. 5C to FIG. 7C. Thus, a PMOS transistor 40 shown in FIG. 9C is completed. On the other hand, the gate electrode 20 is formed above the P-type well 18 with a gate insulating layer 73 interposed between the P-type well 18 and the gate electrode 20. Thus, an NMOS transistor 50 is formed in the P-type well 18. The NMOS transistor 50 includes a channel area 18c extending in the Y-direction.

For example, when the P-type area 67 is not formed in the NMOS transistor 50, a threshold voltage is lowered due to a reverse narrow channel effect, and a kink, what is called a Hump, occurs in the subthreshold characteristics of a drain current. Therefore, it is favorable to form the P-type area 67 and thus suppress the reverse narrow channel effect. However, due to the formation of the P-type area 67, the P-type area 61 is formed also in the N-type well 13.

In FIG. 10, the broken line shown by $P_{MAX}$ shows the peak concentration of the P-type impurities ion-implanted into the inner surface of each of the trenches. In this example, an area where the concentration of the P-type impurity becomes higher than the concentration of the N-type impurity is generated between the profiles $IP_1$ and $IP_2$ of the N-type impurity. Thus, the P-type area 61 is formed inside the N-type well 13.

Figure 11A:
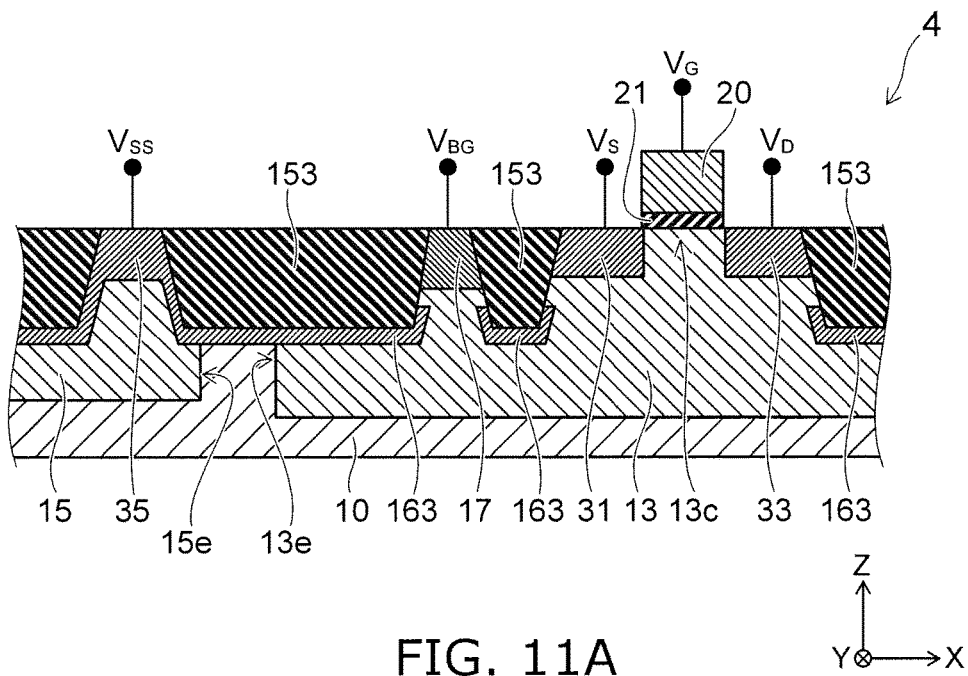
FIGS. 11A and 11B are schematic views showing a semiconductor device according to a comparative example of the second embodiment.
Figure 11B:
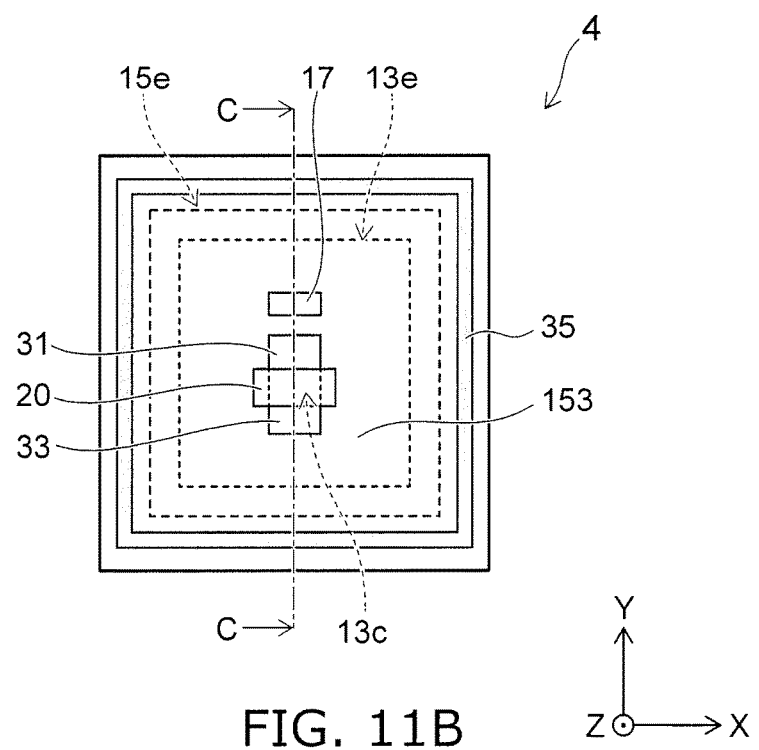

FIGS. 11A and 11B are schematic views showing a semiconductor device 4 according to a comparative example of the second embodiment. FIG. 11A is a partial sectional view along the line C-C shown in FIG. 11B. FIG. 11B is a top view of the semiconductor device 4.

As shown in FIG. 11A, the semiconductor device 4 includes the semiconductor substrate 10 including the N-type well 13 and the P-type well 15, and the gate electrode 20. The source area 31, the drain area 33, and the N-type contact area 17 are provided in the N-type well 13. The P-type contact area 35 is provided in the P-type well 15. An STI 153 is provided above the N-type well 13.

As shown in FIG. 11B, the STI 153 is formed so as to surround the source area 31, the drain area 33, and the channel area 13c. Moreover, the STI 153 surrounds the N-type contact area 17. Further, the STI 153 is provided so as to spread from above the N-type well 13 to above the P-type well 15. In other words, an outer peripheral portion of the STI 153 is provided above the edge 13e of the N-type well 13 and the edge 15e of the P-type well 15. Then, a P-type area 163 is formed at a bottom portion of the STI 153.

The P-type area 163 serves as, for example, a leak path that short-circuits a P-N junction between the N-type well 13 and the semiconductor substrate 10, and reduces the breakdown voltage of the N-type well 13. That is, when a high voltage is applied to the N-type well 13, a leak current due to punch-through of a depletion layer may flow between the N-type contact area 17 and an edge of the P-type area 163 close thereto. Moreover, there also arises a breakdown voltage reduction of the P-N junction between the N-type well 13 and the semiconductor substrate 10. Thereby, for example, a voltage applied to the memory cell MC is reduced, which may cause programming failure of data.

For example, the formation of the P-type area 163 is avoided by covering the N-type well 13 with an ion implantation mask in the ion implantation process shown in FIG. 9A. However, the addition of the ion implantation mask lengthens a TAT (Turn around Time) of the manufacturing process and raises the manufacturing costs.

In contrast to this, the STI 23 is selectively provided above the N-type well 13, and does not spread outside the N-type well 13 in the semiconductor device 3 shown in FIG. 9C. Hence, the STI is not provided above the edge 13e of the N-type well 13. Thus, the P-type area that short-circuits the P-N junction between the N-type well 13 and the semiconductor substrate 10 is not formed at the bottom portion of the STI. Moreover, the breakdown voltage of the P-N junction can be improved by providing the peripheral edge portion 13b in the N-type well 13.

Figure 12A:
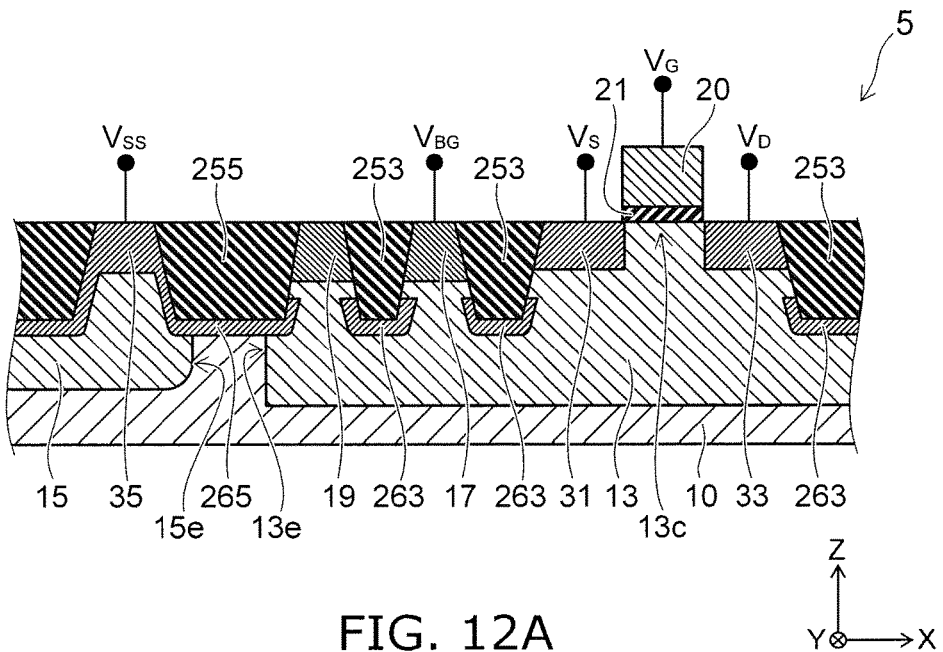
FIGS. 12A and 12B are schematic views showing a semiconductor device according to a variation of the second embodiment.
Figure 12B:
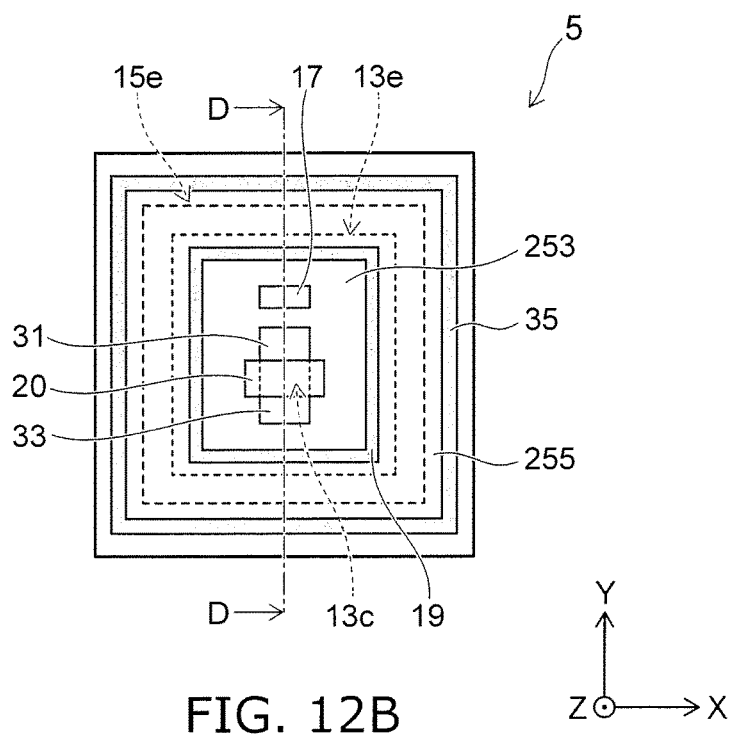

FIGS. 12A and 12B are schematic views showing a semiconductor device 5 according to a variation of the second embodiment. FIG. 12A is a partial sectional view along the line D-D shown in FIG. 12B. FIG. 12B is a top view of the semiconductor device 5.

As shown in FIG. 12A, the semiconductor device 5 includes the semiconductor substrate 10 including the N-type well 13 and the P-type well 15, and the gate electrode 20. The source area 31, the drain area 33, the N-type contact area 17, and an N-type area 19 are provided in the N-type well 13. The P-type contact area 35 is provided in the P-type well 15. An STI 253 is selectively provided above the N-type well 13.

As shown in FIG. 12B, the STI 253 is formed so as to surround the source area 31, the drain area 33, and the channel area 13c. Moreover, the STI 253 surrounds the N-type contact area 17. The N-type area 19 is provided so as to surround the STI 253. Further, an STI 255 is provided between the N-type well 13 and the P-type well 15. The STI 255 is provided above the edge 13e of the N-type well 13 and the edge 15e of the P-type well 15. Then, a P-type area 263 is formed at a bottom portion of the STI 253; and a P-type area 265 is formed at a bottom portion of the STI 255.

A voltage is not applied to the N-type area 19, so that the N-type area 19 serves as so called a floating node. Then, the P-type area 265 across the P-N junction between the N-type well 13 and the semiconductor substrate 10 is separated from the P-type area 263 close to the N-type contact area 17. That is, a leak current that flows through the P-type area 265 is suppressed by the N-type area 19, and thus, it becomes possible to improve the breakdown voltage of the N-type well 13.

Figure 13A:
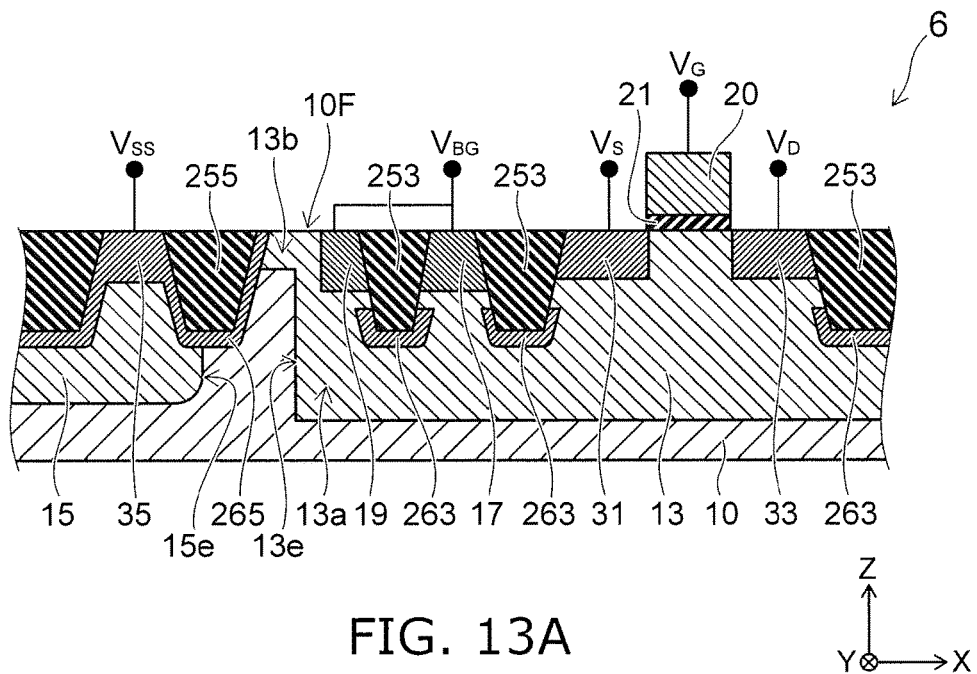
FIGS. 13A and 13B are schematic views showing a semiconductor device according to another variation of the second embodiment.
Figure 13B:
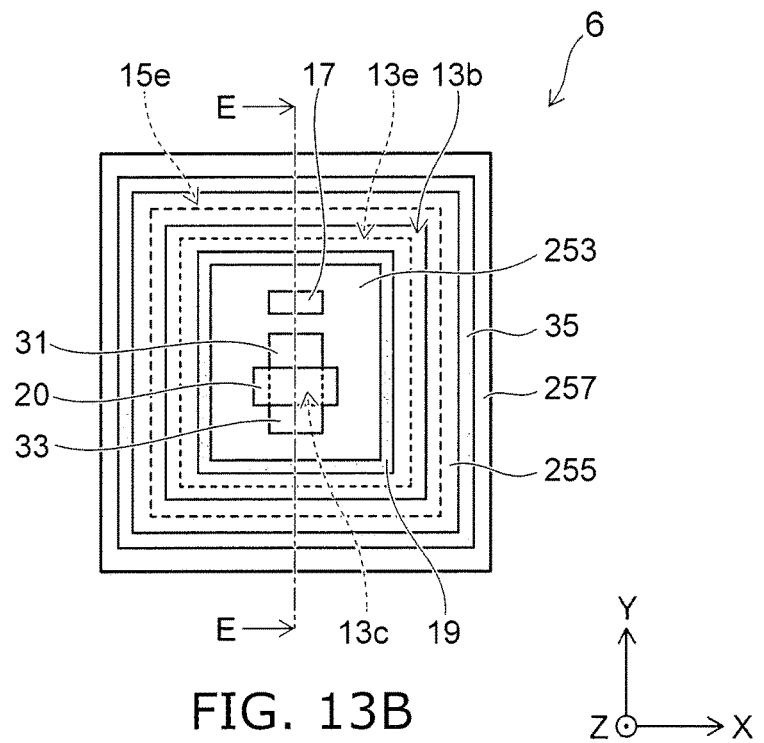

FIGS. 13A and 13B are schematic views showing a semiconductor device 6 according to another variation of the second embodiment. FIG. 13A is a partial sectional view along the line E-E shown in FIG. 13B. FIG. 13B is a top view of the semiconductor device 6.

As shown in FIG. 13A, the semiconductor device 6 includes the semiconductor substrate 10 having the N-type well 13 and the P-type well 15, and the gate electrode 20. The N-type well 13 includes the main portion 13a and the peripheral edge portion 13b. The source area 31, the drain area 33, the N-type contact area 17, and the N-type area 19 are provided in the main portion 13a. The STI 253 is selectively provided above the main portion 13a. The P-type contact area 35 is provided in the P-type well 15.

As shown in FIG. 13B, the STI 253 is formed so as to surround the source area 31, the drain area 33, and the channel area 13c. Moreover, the STI 253 surrounds the N-type contact area 17. The N-type area 19 is provided so as to surround the STI 253. Further, the STI 255 is provided so as to surround the N-type well 13. The STI 255 is provided separately from the STI 253, and is located above the edge 15e of the P-type well 15. The peripheral edge portion 13b extends outward from the main portion 13a between the STI 253 and the STI 255.

The P-type area 263 is formed at the bottom portion of the STI 253; and the P-type area 265 is formed at the bottom portion of the STI 255. The P-type area 265 is separated from the P-type area 263 by the outer peripheral portion of the main portion 13a and the peripheral edge portion 13b of the N-type well 13, and thus, a leak path of a current through the P-type area is not formed. Moreover, in this example, the back gate voltage $V_{BG}$, which is the same as that of the N-type contact area 17, is applied to the N-type area 19. Then, the spread of a depletion layer to the semiconductor substrate 10 is promoted by the peripheral edge portion 13b of the N-type well 13, and thereby, an electric field at the edge 13e of the N-type well 13 is reduced. Thus, it becomes possible to improve the junction breakdown voltage of the N-type well 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor substrate of a first conductivity type including a first surface and a second surface on a side opposite to the first surface, the semiconductor substrate including a first area of a second conductivity type on the first surface side, and second and third areas of the first conductivity type on the first surface side of the first area, the second and third areas being disposed away from an edge of the first area, and being arranged in a direction along the first surface;
   a control electrode provided above a portion of the first area between the second and third areas on the first surface side of the semiconductor substrate;
   a first insulating layer selectively provided on the first area on the first surface side and surrounding the second and third areas; and
   a second insulating layer surrounding the first insulating layer on the first surface side and provided on an outer edge of the first area,
   the semiconductor substrate further including a fourth area of the second conductivity type and a fifth area of the second conductivity type,
   the fourth area being positioned away from the second and third areas on the first surface side, and being surrounded by the first insulating layer, and
   the fifth area being provided on the first surface side between the first insulating layer and the second insulating layer.

2. The device according to claim 1, wherein
   the semiconductor substrate further includes a sixth area of the first conductivity type on the first surface side, the sixth area of the first conductivity type surrounding the first area and being positioned away from the first area; and
   an edge of the sixth area on the first area side is located below the second insulating layer.

3. A semiconductor device comprising:
   a semiconductor substrate of a first conductivity type including a first area of a second conductivity type;

a second area of the first conductivity type being provided on the first area;
a third area of the first conductivity type being provided on the first area, the third area being arranged apart from the second area in a first direction parallel to a surface of the substrate;
a control electrode being provided above a portion of the first area between the second area and the third area;
a fourth area of the second conductivity type being provided on the first area, a concentration of carriers in the fourth area being different from a concentration of carriers in the first area, the fourth area being arranged apart from the second area and the third area in the first direction;
a fifth area of the second conductivity type being provided on the first area, a concentration of carriers in the fifth area being different from the concentration of carriers in the first area, wherein the fifth area includes a first portion of the fifth area extending in the first direction and a second portion of the fifth area extending in a second direction that crosses the first direction and is parallel to the surface of the substrate, and the fifth area is arranged apart from the second area, the third area and the fourth area in the first direction;
a first insulator being provided on the first area, the first insulator including a first portion and a second portion, the first portion being in contact with the second area and the fourth area, and the second portion being in contact with the fourth area and the fifth area;
a sixth area of the first conductivity type being provided on the substrate, the sixth area being arranged apart from the first area, the second area, the third area, the fourth area, and the fifth area in the first direction; and
a second insulator being provided on the sixth area and the first area, the second insulator being in contact with the fifth area.

4. The semiconductor device according to claim 3, further comprising a seventh area of the first conductivity type being provided on the sixth area, a concentration of carriers in the seventh area being different from the concentration of carriers in the sixth area, the seventh area being in contact with the second insulator.

5. The semiconductor device according to claim 4, further comprising an eighth area of the first conductivity type being in contact with the seventh area, the second insulator and the first area.

6. The semiconductor device according to claim 3, further comprising a contact electrically connected to the fourth area to apply a voltage.

7. The semiconductor device according to claim 3, wherein the first insulator is in contact with the third area.

8. The semiconductor device according to claim 7, wherein the first insulator includes a third portion being in contact with the third area and the fifth area.

9. The semiconductor device according to claim 3, wherein the second area is a source of carriers, and the third area is a drain of the carriers.

10. The semiconductor device according to claim 3, wherein the first insulator and the second insulator are formed of a shallow trench isolation (STI).

11. The semiconductor device according to claim 3, wherein the first insulator is surrounded by the first portion of the fifth area and the second portion of the fifth area.

12. A semiconductor device comprising:
a semiconductor substrate of a first conductivity type including a first area of a second conductivity type;
a second area of the first conductivity type being provided on the first area;
a third area of the first conductivity type being provided on the first area, the third area being arranged apart from the second area in a first direction parallel to a surface of the substrate;
a control electrode being provided above a portion of the first area between the second area and the third area;
a fourth area of the second conductivity type being provided on the first area, a concentration of carriers in the fourth area being different from a concentration of carriers in the first area, the fourth area being arranged apart from the second area and the third area in the first direction;
a fifth area of the second conductivity type being provided on the first area, a concentration of carriers in the fifth area being different from the concentration of carriers in the first area, the fifth area includes a first portion of the fifth area extending in the first direction and a second portion of the fifth area extending in a second direction crossing the first direction and parallel to the surface of the substrate, the fifth area being arranged apart from the second area, third area and the fourth area in the first direction;
a first insulator being provided on the first area, the first insulator including a first portion and a second portion, the first portion being in contact with the second area and the fourth area, and the second portion being in contact with the fourth area and the fifth area;
a sixth area of the first conductivity type being provided on the substrate, the sixth area being arranged apart from the second area, third area, the fourth area and the fifth area in the first direction;
a second insulator being provided on the sixth area; and
a seventh area of the second conductivity type being provided on the first area, a concentration of carriers in the seven area being lower than the concentration of carriers in the first area, the seventh area being provided between the second insulator and the fifth area.

13. The semiconductor device according to claim 12, wherein the first insulator is in contact with the third area.

14. The semiconductor device according to claim 13, wherein the first insulator includes a third portion being in contact with the third area and the fifth area.

15. The semiconductor device according to claim 12, further comprising a contact electrically connected to the fourth area to apply a voltage.

16. The semiconductor device according to claim 12, further comprising a eighth area of the first conductivity type being provided on the sixth area, a concentration of carriers in the eighth area being different from the concentration of carriers in the sixth area, the eighth area being in contact with the second insulator.

17. The semiconductor device according to claim 12, further comprising a ninth area of the first conductivity type being in contact with the second insulator and the seventh area, a concentration of carriers in the ninth area being different from the concentration of carriers in the sixth area.

18. The semiconductor device according to claim 12, wherein the second area is a source of carriers, and the third area is a drain of the carriers.

19. The semiconductor device according to claim 12, wherein the first insulator and the second insulator are formed of a shallow trench isolation (STI).

20. The semiconductor device according to claim 12, wherein the first insulator is surrounded by the first portion of the fifth area and the second portion of the fifth area.

* * * * *